(12) United States Patent
Singh et al.

(10) Patent No.: US 10,403,560 B2
(45) Date of Patent: Sep. 3, 2019

(54) THERMAL COOLING SYSTEM

(71) Applicant: Intel Corporation, Santa Clara, CA (US)

(72) Inventors: Bijendra Singh, Bangalore (IN); Sachin Bedare, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,927

(22) Filed: Sep. 28, 2018

(65) Prior Publication Data

US 2019/0045665 A1    Feb. 7, 2019

(51) Int. Cl.
| | |
|---|---|
| *H01L 23/427* | (2006.01) |
| *H05K 7/20* | (2006.01) |
| *H05K 1/02* | (2006.01) |
| *C09K 5/06* | (2006.01) |
| *G06F 1/20* | (2006.01) |

(52) U.S. Cl.
CPC .......... *H01L 23/4275* (2013.01); *C09K 5/066* (2013.01); *G06F 1/20* (2013.01); *H05K 1/02* (2013.01); *H05K 7/205* (2013.01); *H05K 7/20463* (2013.01); *H05K 7/2029* (2013.01)

(58) Field of Classification Search
CPC ............ H01L 23/36–473; H05K 1/0201–0204
USPC ....................... 361/679.46–679.54, 688–723; 257/712–722
See application file for complete search history.

(56) References Cited

U.S. PATENT DOCUMENTS

| | | | | |
|---|---|---|---|---|
| 6,459,582 B1* | 10/2002 | Ali | ....................... | H01L 23/4006 257/715 |
| 6,894,396 B2* | 5/2005 | Shioga | ................ | H01L 23/3107 257/499 |
| 7,705,447 B2* | 4/2010 | Ganesan | ............... | H01L 23/367 257/713 |
| 9,288,930 B2* | 3/2016 | Kim | ....................... | H01L 23/373 |
| 10,159,152 B2* | 12/2018 | Campbell | .............. | H05K 1/183 |
| 10,187,996 B2* | 1/2019 | Swaminathan | ........ | H05K 1/141 |
| 2006/0043548 A1* | 3/2006 | Kanda | .................... | H01L 23/562 257/678 |
| 2006/0091538 A1* | 5/2006 | Kabadi | ................ | H05K 7/1061 257/737 |

* cited by examiner

*Primary Examiner* — Zachary Pape
(74) *Attorney, Agent, or Firm* — Patent Capital Group

(57) ABSTRACT

Particular embodiments described herein provide for a thermal cooling system that is part of a device that includes a hole-in-motherboard configuration. The device can include a substrate, one or more dies on a top portion of the substrate, one or more printed circuit boards below the substrate, where the printed circuit boards are coupled to the substrate with solder balls, and one or more land side capacitors below the substrate. A thermal conducting plate, phase change material, and one or more sponge walls to help insulate the solder balls from the thermal conductive layer can be located in the hole of the hole-in-motherboard configuration and help transfer heat and thermal energy away from the device.

21 Claims, 14 Drawing Sheets

THERMAL COOLING SYSTEM

TECHNICAL FIELD

This disclosure relates in general to the field of computing and/or device cooling, and more particularly, to a thermal cooling system.

BACKGROUND

Emerging trends in systems place increasing performance demands on the system. The increasing performance demands can cause additional power requirements for the system. Insufficient cooling for increased power can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
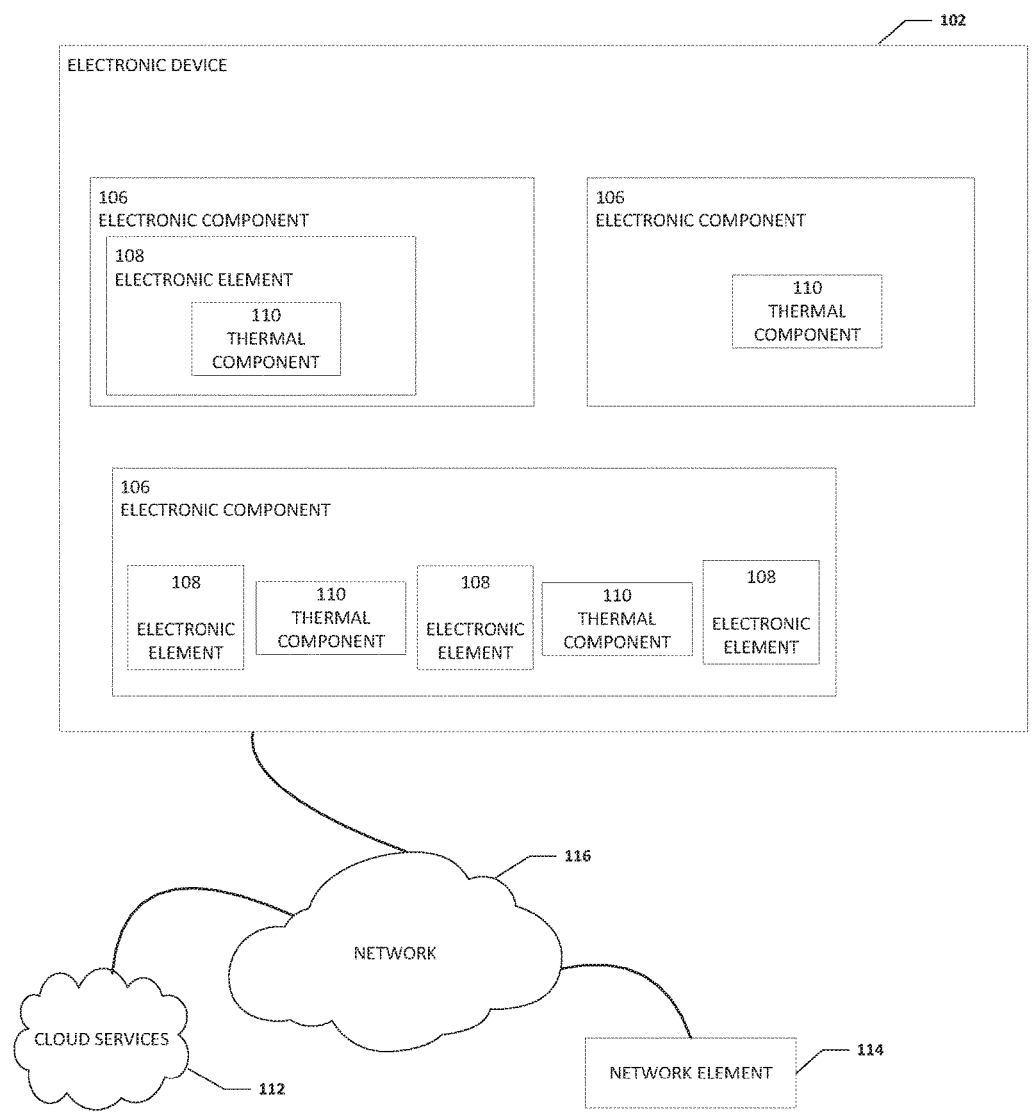
FIG. 1 is a simplified block diagram illustrating an embodiment of a system to enable a thermal cooling system, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to enabling a reversible direction thermal cooling system. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Implementations of the embodiments disclosed herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and MoS2, organic materials such as pentacene, transparent oxides such as IGZO poly/amorphous (low temperature of dep) III-V semiconductors and Ge/Si, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

FIG. 1 is a simplified block diagram of an electronic device configured to enable a thermal cooling system, in accordance with an embodiment of the present disclosure. In an example, electronic device 102 can include one or more electronic components 106. Each of the one or more electronic components 106 can include one or more electronic elements 108 and a thermal component 110. In some examples, the electronic element 108 can include thermal component 110. In other example, electronic component 106 may not include any electronic elements 108 but may include thermal component 110. Electronic device 102 may be in communication with cloud services 112 and/or network element 114 using network 116.

Each of electronic components 106 may be a motherboard, system on a chip (SoC), etc. Each electronic element 108 can be a heat generating device and may be a processor, logic unit, field programmable gate array (FPGA), chip set, graphics processor, graphics card, battery, memory, or some other type of heat generating device. Thermal component 110 can be configured as a thermal cooling system and more particularly, a passive thermal cooling system to help reduce the temperature or thermal energy of electronic device 102, one or more of electronic components 106, and/or one or more electronic elements 108.

In a specific example, each electronic component 106 includes a hole. As used herein, the term "hole" includes a cavity, recess, pit, depression, or other hollowed out area. The hole is used for discrete components such as external land side capacitors (LSCS) for integrated high-speed voltage-regulators on the bottom of the electronic component 106. Such components need a hole for low-pitch ball grid array (BGA) packages to avoid physical interference. Thermal component 110 can be located in the hole to help cool at least a portion of the system and to aid any existing thermal solutions by taking advantage of proximity to the heat source. Electronic device 102 can be any electronic device (e.g., computer, smartphone, laptop, desktop, Internet-of-Things device, vehicle, handheld electronic device, personal digital assistant, wearable, etc.) that includes one or more electronic components 106 and/or electronic elements 108 that include a hole.

It is to be understood that other embodiments may be utilized and structural changes may be made without departing from the scope of the present disclosure. Substantial flexibility is provided by electronic device 102 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques of a thermal cooling system, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems. For example, in some devices, it can be difficult to cool a particular heat source.

Hole in motherboard (HiMB) designs (sometimes referred to as a recess in motherboard (RiMB) design) has enabled increased packaging density of functional components (voltage regulation, EMI shielding) for next generation mobile products. In small form factor packages, the dynamic warpage of the silicon, package and board materials during SMT reflow process create potential interference between the mother board and bottom package components (or landside package components) that cannot be supported by traditional collapse heights, which may result in solder joint opens. One solution to minimize interference of these bottom components with the motherboard includes either removing the printed circuit board (PCB) material to create a hole in the motherboard or, in more advanced cases, removing finite layers of the PCB material to allow for components to sit into the hole or recess without impacting the surface mount process. The HiMB architecture was created to address this concern while still preserving a majority of layers in the motherboard under the CPU shadow to be available for routing. For tighter hardware integration, some mobile SOCs absorb discrete components in the motherboard (e.g., LSCs for integrated high-speed voltage-regulators on the bottom/land side of the motherboard). Such components need a hole in the PCB for thinner low-pitch BGA packages to avoid physical interference.

Passive-cooled form-factor designs like detachables, dual-display devices, clamshells etc. that use mobile SOCs are thinning down in size and involve very complex system-designs. In addition, compute performance (especially PL2/turbo) targets continue to increase, calling for ways to improve transient thermal performance. Current solutions are not typically sufficient to meet high performance targets. Pricier and more elaborate thermal solutions based on a heat pipe or vapor chamber address this, but besides being costly, these solutions are also relatively thick and drive the system stack up. Larger air gaps and/or costlier spreader material are other alternatives but come with a cost and thickness penalty. Some thermal solutions for flip-chip packages make use of low top side (junction-case) thermal resistance of the exposed die. The solutions include extending metal EMI shielding as a thermal solution by physically connecting the metal EMI shielding to the package with a gap pad or by attaching a spreader plate with a thermal interface material (TIM) (e.g. thermal grease) on top of the package. Hole-in-motherboard (HiMB) designs additionally require metal foil to avoid signal leakage through the bottom of the package and the metal foil can also somewhat act as heat spreader, although it is not very efficient and cannot transfer very much thermal energy. The current solutions often do not provide enough thermal cooling, especially when turbo performance is added. What is needed is a thermal cooling system to improve transient thermal performance of electronic devices.

A device to help mitigate the thermal challenges of a system, as outlined in FIG. 1, can resolve these issues (and others). In an example, an electronic device (e.g., electronic device 102) that includes a hole or a component or element that includes a hole can be configured to include a thermal component within the hole. More specifically, non-conductive sponge walls can be added between solder balls and the hole. Phase change material can be added to at least partially fill the hole, and a thermal conducting plate can be added to help transfer heat or thermal energy away from the component or element.

In a specific example, the thermal component can include a phase change material with a relatively high heat of fusion (paraffin based material, salt hydrate, solid-solid phase change material (PCMS), liquid metal based material, etc.) or some other thermally conductive material. The thermal component can also include a high thermal conductivity material plate and pillar structure (e.g., copper, graphite, carbon nanotubes, gold, etc.) configured to help with latent heat absorption. The thermal component can extend to the bottom side of a substrate 124 under the die shadow to improve the heat discharge rates.

In a specific example, copper plates embedded in the phase change material can be mutually connected through copper micro-pillars and the phase change material can fill the mid-space and gaps in a LSC region. In some examples, the phase change material can be replaced with pure copper or other thermally conductive mater but will require an electrically non-conductive thermal interface material. Any phase change material or thermal interface material pump-out into the solder balls region can be contained within a walled structure created by dispensing non-conductive sponge material. This allows the thermal cooling system to use the thermal component to enhance the overall thermal budget of electronic device 102 along with improving turbo, boost, enhanced, etc. performance of electronic device 102. The thermal component can facilitate a relatively easy heat escape path from the bottom of the component or element and the proximity of the thermal component to the component or element can help enable an improved transient performance over current solutions. The thermal component impact can be enhanced further by connecting a board side spreader that is coupled to cooler regions, by further increasing the heat transfer area by including dimples or other fin structures, or by coupling an active cooling system to the thermal component.

In an example implementation, electronic device 102, is meant to encompass a computer, a personal digital assistant (PDA), a laptop or electronic notebook, a cellular telephone, smart phone, network elements, network appliances, servers, routers, switches, gateways, bridges, load balancers, processors, modules, or any other device, component, element, or object that includes a heat source and a hole, or at least a first heat source on a first side and at least a second heat source on a second side and a hole between the first heat source and the second heat source. In an example, the heat source is above the hole. In another example, the first side is opposite the second side with the hole between the first side and the second side. In yet other examples, the heat source may be on one side or on multiple sides (top, first side, and/or second side) of the hole. Electronic device 102 may include any suitable hardware, software, components, modules, or objects, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements for storing information. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

Additionally, electronic device 102 may include a processor that can execute software or an algorithm to perform activities. A processor can execute any type of instructions associated with the data. In one example, the processors could transform an element or an article (e.g., data) from one state or thing to another state or thing. In another example, the activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
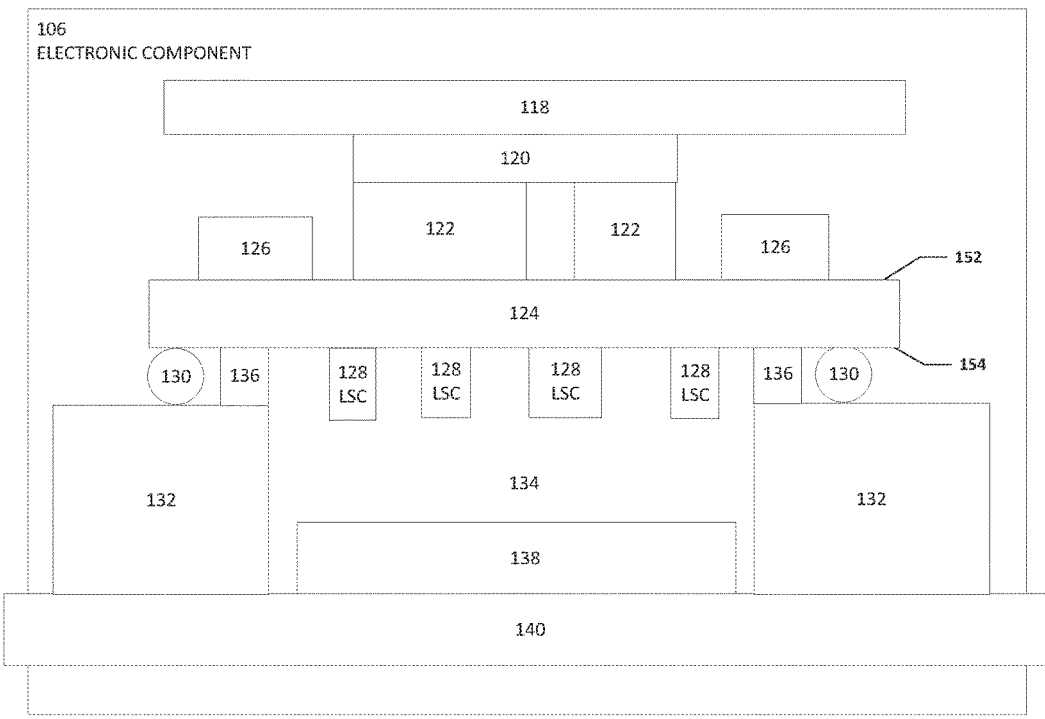
FIG. 2A is a simplified block diagram illustrating an embodiment of a portion of a thermal cooling system, in accordance with an embodiment of the present disclosure.
Figure 2B:
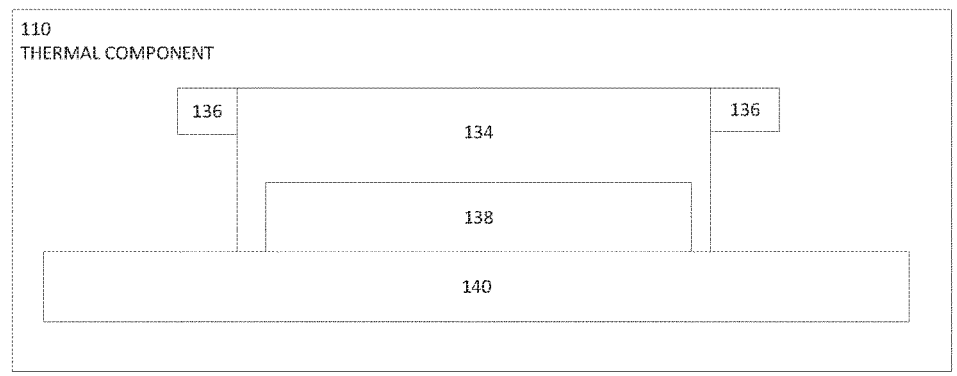
FIG. 2B is a simplified block diagram illustrating an embodiment of a portion of a thermal cooling system, in accordance with an embodiment of the present disclosure.

Turning to FIG. 2A, FIG. 2A is a simplified block diagram of electronic component 106 configured to include a thermal cooling system. Electronic component 106 can include a heat spreader and/or electromagnetic interference (EMI) shield 118, a TIM layer 120, one or more dies 122, a substrate 124, one or more stiffeners 126, one or more LSC 128, one or more solder balls 130, one or more printed circuit boards (PCBs) 132, phase change material 134, non-conductive sponge walls 136, a thermal conducting plate 138, and thermal transfer extension 140. Substrate 124 can include a top side 152 and a bottom side 154. Bottom side 154 is sometimes referred to as a land side. Heat spreader and/or electromagnetic interference (EMI) shield 118, TIM layer 120, one or more dies 122, substrate 124, and one or more stiffeners 126 can be located on top side 152 of substrate 124. One or more LSC 128, one or more solder balls 130, one or more printed circuit boards (PCBs) 132, phase change material 134, non-conductive sponge walls 136, thermal conducting plate 138, and thermal transfer extension 140 can be located on bottom side 154 of substrate 124. As illustrated in FIG. 2B, thermal component 110 includes phase change material 134, non-conductive sponge walls 136, and thermal conducting plate 138. Electronic element 108 can include heat spreader and/or EMI shield 118, TIM layer 120, one or more dies 122, substrate 124, one or more stiffeners 126, one or more LSC 128, one or more solder balls 130, and one or more PCBs 132.

Returning to FIG. 2A, heat spreader and/or electromagnetic interference (EMI) shield 118 can be a primary heat dissipate system coupled to one or more dies 122 using TIM layer 120. Each one or more die 122 can be a block of semiconducting material on which a functional circuit is fabricated. Each LSC 128 can be a capacitor that is attached to substrate 124 on bottom side 154 under the die shadow. LSCs are typically bypass capacitors that sit as close as practically possible to dies 122 in order to increase their effectiveness. LSCs 128 can be used to reduce noise and impedance and to maintain a constant voltage under various operating frequencies. The form factor of LSCs 128 is often dictated by various factors such as the substrate size and the collapsed height of solder balls 130. One or more LSC 128 is typically larger than solder balls 130 which is a main reason for the HiMB design.

Solder balls 130, or a solder bump (or simply a "ball" or "bumps") is a ball of solder that provides contact between one or more dies 122 (through substrate 124) and PCB 132, as well as between stacked packages in multichip modules. Solder balls 130 can be placed manually or by automated equipment and can be held in place with a tacky flux PCBs 132 electrically connect electronic components or electrical components using conductive tracks, pads and/or other features etched from one or more sheet layers of a conductive material (e.g., copper) laminated onto and/or between sheet layers of a non-conductive substrate. Components are generally soldered onto PCB 132 using solder balls 130.

Phase change material 134 can be at least partially electrically non-conductive, thermal conductive, and have relatively high latency heat of fusion that can absorb a relatively large amount of heat or thermal energy. In some examples, phase change material 134 has a low electrical conductivity. Phase change material 134 can be paraffin based material, salt hydrates, solid-solid PCMs, liquid metal based material, or some other material that is at least partially electrically non-conductive but is thermally conductive and can help insulate solder balls 130 and transfer heat or thermal energy. In an example, phase change material 134 can be an electrically non-conductive, thermal conductive mesh structure. In some examples, phase-change material 134 may not actually be a phase-change material but is still a thermally conductive material that helps with cooling. Non-conductive sponge wall 136 can be configured to help contain phase change material 134 and help prevent electrical conductivity from phase change material 134 from reaching or coupling with solder balls 130. In a specific example, non-conductive sponge wall 136 can be flexible and may be made of a non-conductive foam.

Thermal conducting plate 138 can help to transfer heat or thermal energy captured by phase change material 134 and transfer the heat or thermal energy to thermal transfer extension 140. Thermal conducting plate 138 can be comprised of copper, graphite, carbon nanotubes, gold, or some other material that can help transfer heat or thermal energy. In some examples, thermal conducting plate 138 may be a vapor chamber. In an example, thermal transfer extension 140 can be coupled or connected to a board side spreader to transfer thermal energy to cooler regions. In addition, thermal transfer extension 140 can further increase the heat transfer area by including dimples or other fin structures. This helps in dissipating the heat by natural and/or forced convection (in case of fan or other flow movers) as well as by radiation. Thermal transfer extension 140 can be comprised of copper, graphite, carbon nanotubes, gold, or some other material that can help transfer heat or thermal energy. In an example, thermal transfer extension 140 is a passive cooling element. In another example, thermal transfer extension 140 is an active cooling element.

Figure 3A:
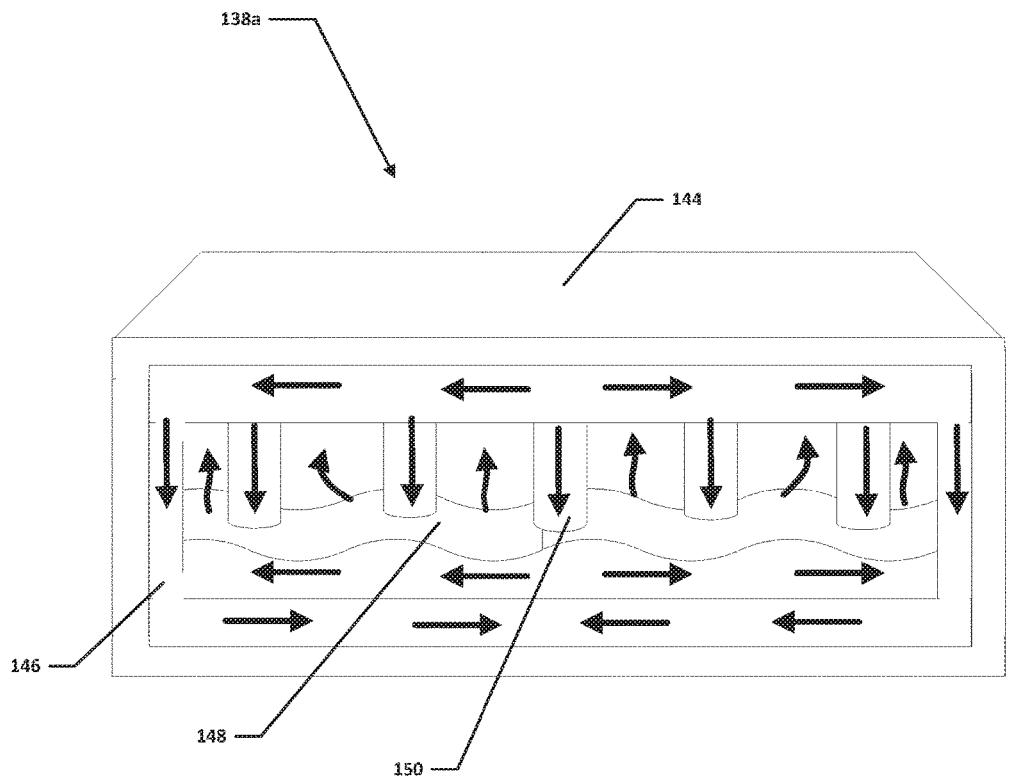
FIG. 3A is a simplified block diagram illustrating an embodiment of a portion of a thermal cooling system, in accordance with an embodiment of the present disclosure.

Turning to FIG. 3A, FIG. 3A is a simplified block diagram illustrating thermal conducting plate 138a as a vapor chamber. While thermal conducting plate 138a is shown as a vapor chamber, thermal conducting plate 138 may be some other device or mechanism that can help to transfer heat or thermal energy captured by phase change material 134 to thermal transfer extension 140. If thermal conducting plate 138a is a vapor chamber or other similar structure, thermal conducting plate 138a can include an outer wall 144 that contains a heat pipe 146 and a liquid 148 in a hermetically sealed environment. Liquid 148 can be water. Support posts 150 can help provide structural support to thermal conducting plate 138a.

In an example, at a hot interface of heat pipe 146 (e.g., the area where outer wall 144 is proximate to phase change material 134) liquid 148 turns into a vapor by absorbing heat from heat pipe 146. The vapor then travels along heat pipe 146 to a cooler interface (e.g., thermal transfer extension 140), condenses back into liquid 148, and releases heat to the cooler interface. Liquid 148 then returns to the hot interface through capillary action, centrifugal force, gravity, etc. and the cycle repeats.

Figure 3B:
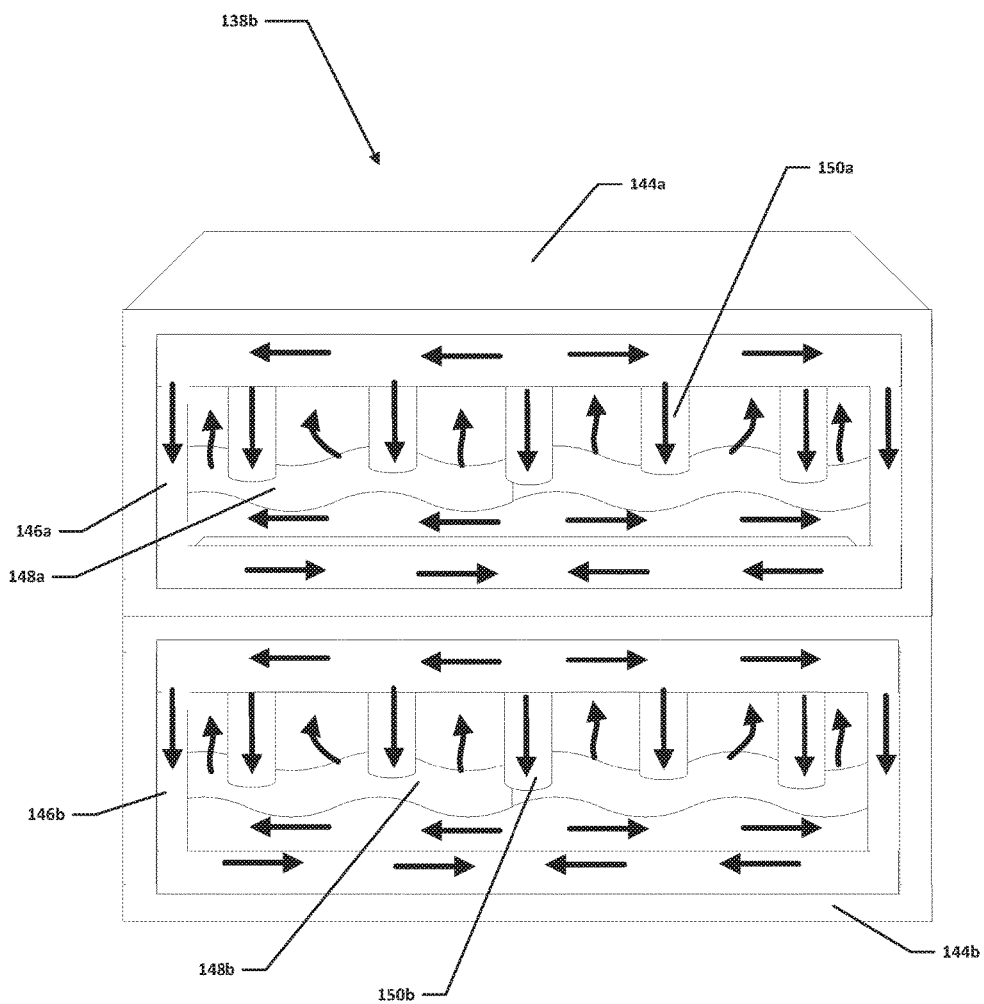
FIG. 3B is a simplified block diagram illustrating an embodiment of a portion of a system to enable a thermal cooling system, in accordance with an embodiment of the present disclosure.

Turning to FIG. 3B, FIG. 3B is a simplified block diagram illustrating thermal conducting plate 138b as a stacked vapor chamber. If thermal conducting plate 138b is a stacked vapor chamber or other similar structure, thermal conducting plate 138b can include an upper vapor chamber outer wall 144a that contains a heat pipe 146a and a liquid 148a in a hermetically sealed environment and a lower vapor chamber outer wall 144b that contains a heat pipe 146b and a liquid 148b in a hermetically sealed environment. Liquid 148a and 148b can be water. Support posts 150a and 150b can help provide structural support to thermal conducting plate 138b.

In an example, at a hot interface of heat pipe 146a (e.g., the area where upper vapor chamber outer wall 144a is proximate to phase change material 134) liquid 148a turns into a vapor by absorbing heat from heat pipe 146a. The vapor then travels along heat pipe 146a to a cooler interface (e.g., vapor chamber outer wall 144b), condenses back into liquid 148 and releases heat to the cooler interface. Liquid 148a then returns to the hot interface through capillary action, centrifugal force, gravity, etc. and the cycle repeats.

At a hot interface of heat pipe 146b (e.g., the area where lower vapor chamber outer wall 144b is proximate to upper vapor chamber outer wall 144a) liquid 148b turns into a vapor by absorbing heat from heat pipe 146b. The vapor then travels along heat pipe 146b to a cooler interface (e.g., thermal transfer extension 140), condenses back into liquid 148b and releases heat to the cooler interface. Liquid 148b then returns to the hot interface through capillary action, centrifugal force, gravity, etc. and the cycle repeats.

Figure 4:
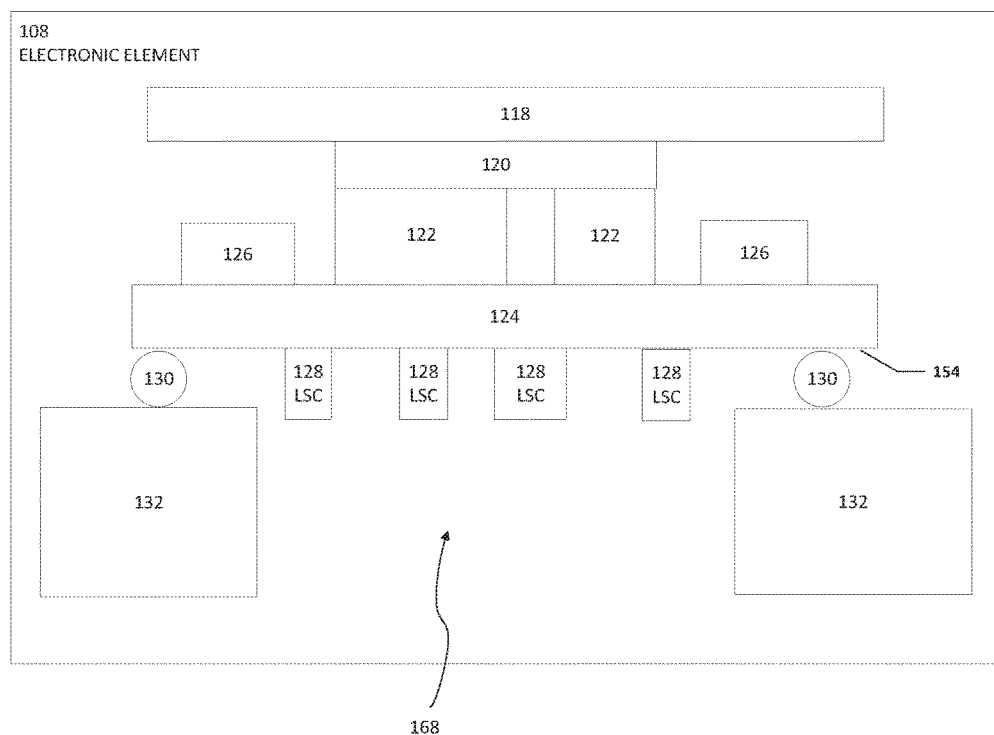
FIG. 4 is a simplified block diagram illustrating an embodiment of a portion of an electronic component, in accordance with an embodiment of the present disclosure.

Turning to FIG. 4, FIG. 4 illustrates one embodiment of one of the early stages of building or creating an electronic component or element that includes thermal component 110. In an embodiment, an electronic component includes a hole. As illustrated in FIG. 4, electronic element 108 includes a hole 168. Hole 168 can be a cavity, recess, pit, depression, or other hollowed out area and is generally defined by bottom side 154 of substrate 124 and sides of PCBs 132. As illustrated in FIG. 4, electronic element 108 can include heat spreader and/or EMI shield 118, TIM layer 120, one or more dies 122, substrate 124, one or more stiffeners 126, one or more LSC 128, one or more solder balls 130, and one or more PCBs 132.

Figure 5:
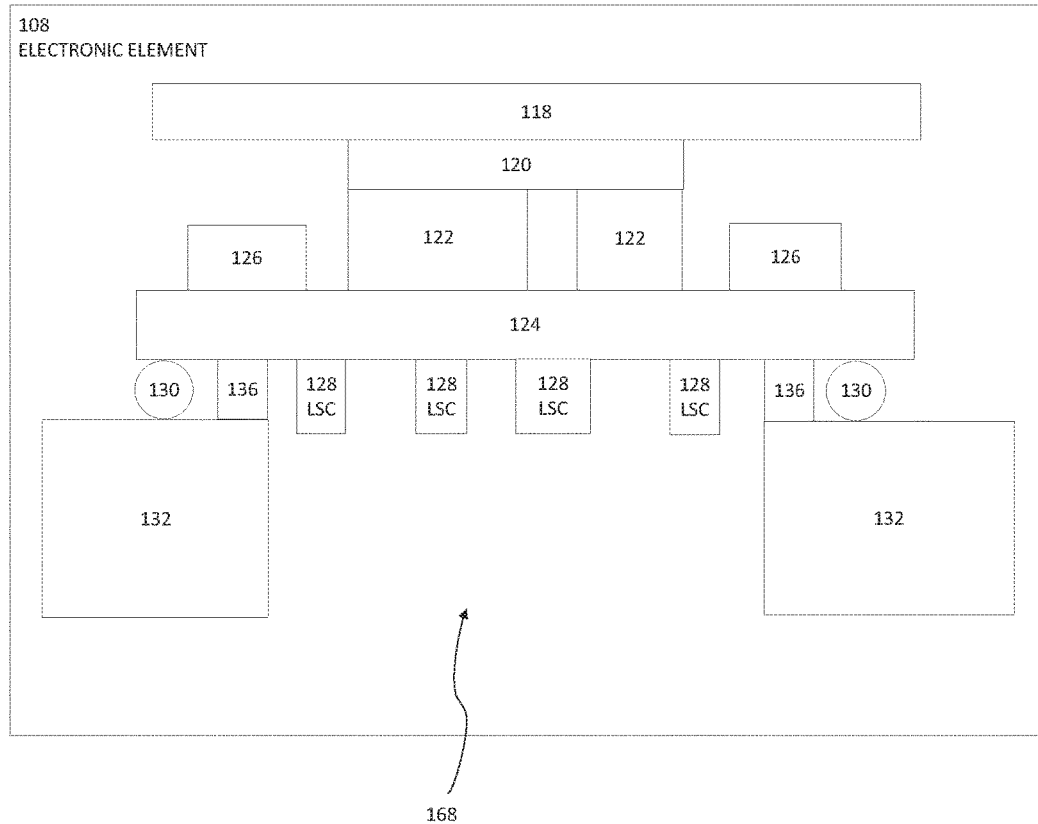
FIG. 5 is a simplified block diagram illustrating an embodiment of a portion of a thermal cooling system, in accordance with an embodiment of the present disclosure.

Turning to FIG. 5, FIG. 5 illustrates one embodiment of one of the early stages of building or creating an electronic component or element that includes thermal component 110. In an embodiment, non-conductive sponge walls 136 are added between solder balls 130 and hole 168 by using a dispensing mechanism (e.g., a thick nozzle syringe, or some other dispensing mechanism). Non-conductive sponge walls 136 can be configured to help contain phase change material 134 that will be added to hole 168 and to help prevent electrical conductivity from phase change material 134 from reaching or coupling with solder balls 130.

Figure 6:
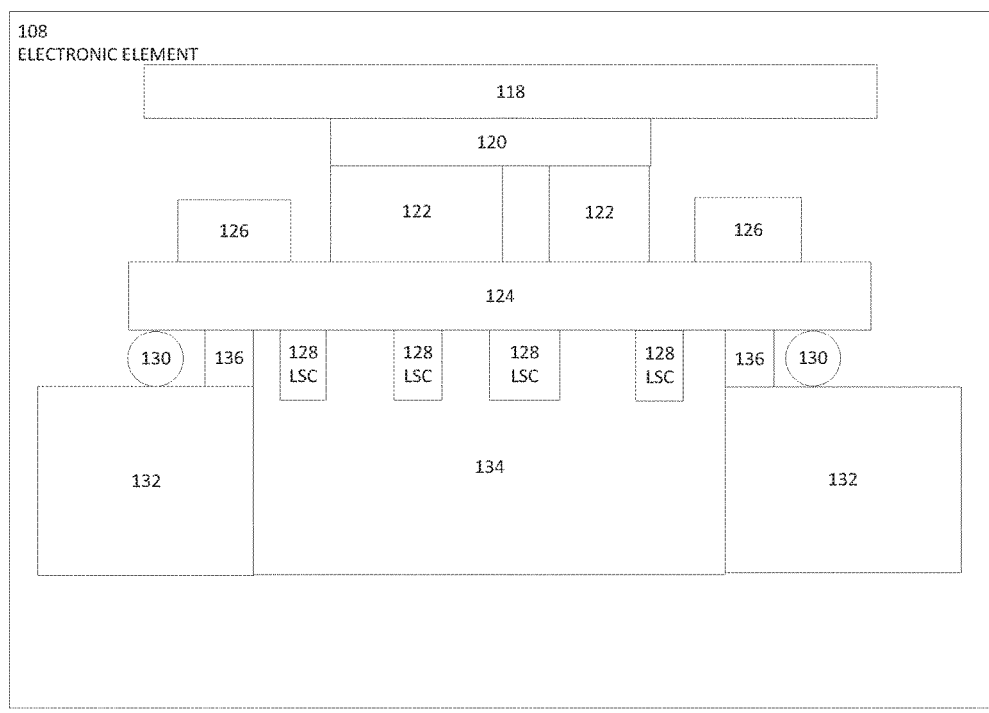
FIG. 6 is a simplified block diagram illustrating an embodiment of a portion of a thermal cooling system, in accordance with an embodiment of the present disclosure.

Turning to FIG. 6, FIG. 6 illustrates one embodiment of one of the stages of building or creating an electronic component or element that includes thermal component 110. In an embodiment, phase change material 134 can be added to at least partially fill hole 168. Phase change material 134 can be at least partially electrically non-conductive to help keep electrical currents from LSCs 128 from reaching or coupling with solder balls 130 and PCBs 132 and/or to help keep a voltage differential from building in the area that included hole 168. Phase change material 134 can be thermally conductive to help transfer heat or thermal energy to thermal transfer extension 140 after thermal conducting plate 138 is added.

Figure 7:
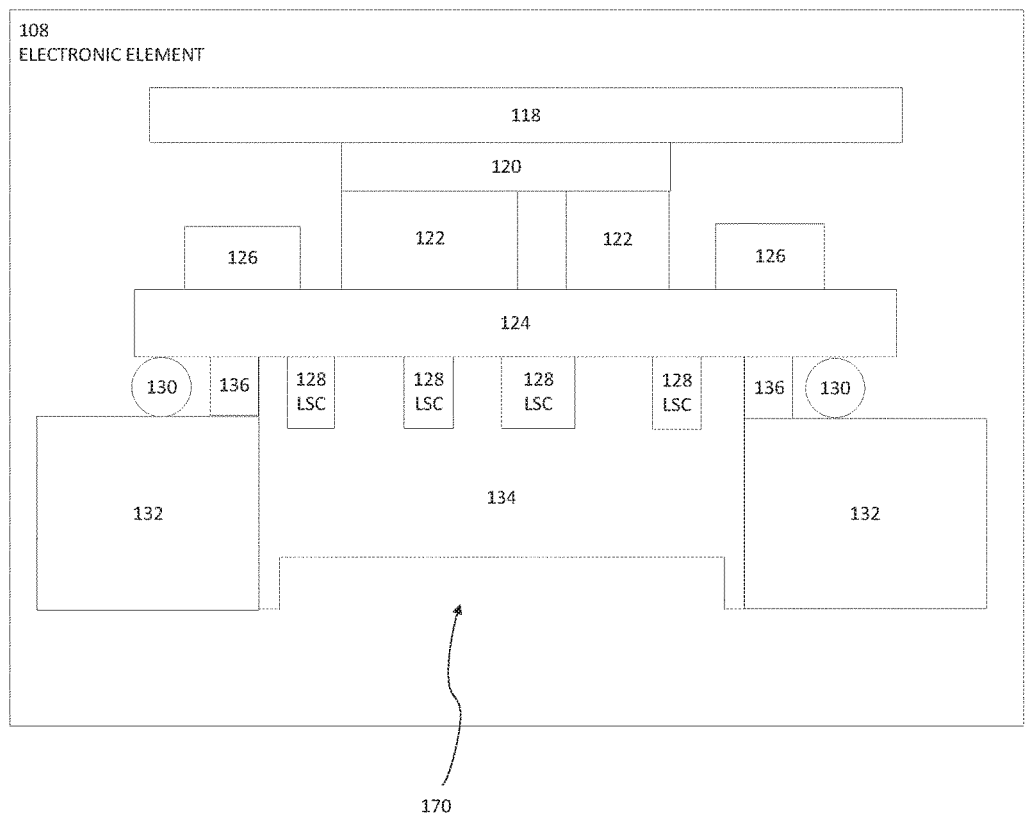
FIG. 7 is a simplified block diagram illustrating an embodiment of a portion of a thermal cooling system, in accordance with an embodiment of the present disclosure.

Turning to FIG. 7, FIG. 7 illustrates one embodiment of one of the stages of building or creating an electronic component or element that includes thermal component 110. In an embodiment, a thermal conducting plate recess 170 can be created in phase change material 134. Thermal conducting plate recess 170 can be created by etching or some other means of removing a portion of phase change material 134 to create thermal conducting plate recess 170.

Figure 8:
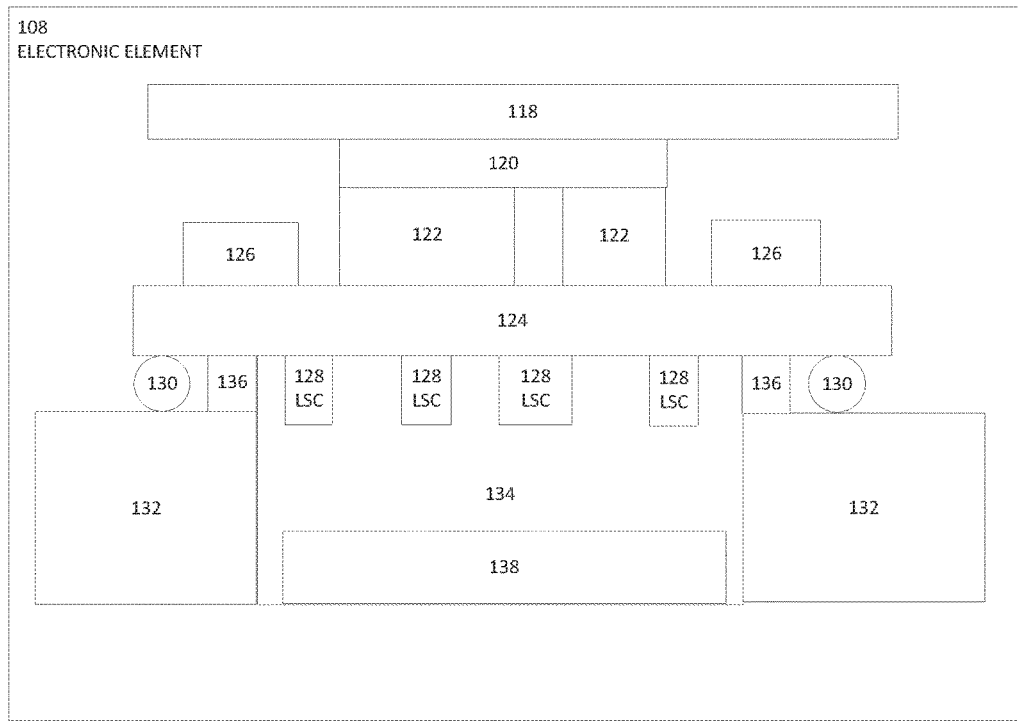
FIG. 8 is a simplified block diagram illustrating an embodiment of a portion of a thermal cooling system, in accordance with an embodiment of the present disclosure.

Turning to FIG. 8, FIG. 8 illustrates one embodiment of one of the stages of building or creating an electronic component or element that includes thermal component 110. In an embodiment, thermal conducting plate 138 can be added to the area created by thermal conducting plate recess 170. In some examples, thermal conducting plate 138 is pre-built or a complete component (e.g., a vapor chamber) and the pre-built or complete component is added or positioned in thermal conducting plate recess 170. In other examples, thermal conducting plate 138 can be created by machining thermal conducting plate 138 on an external spreader plate such as thermal transfer extension 140. Thermal conducting plate 138 helps to transfer heat or thermal energy captured by phase change material 134.

Figure 9:
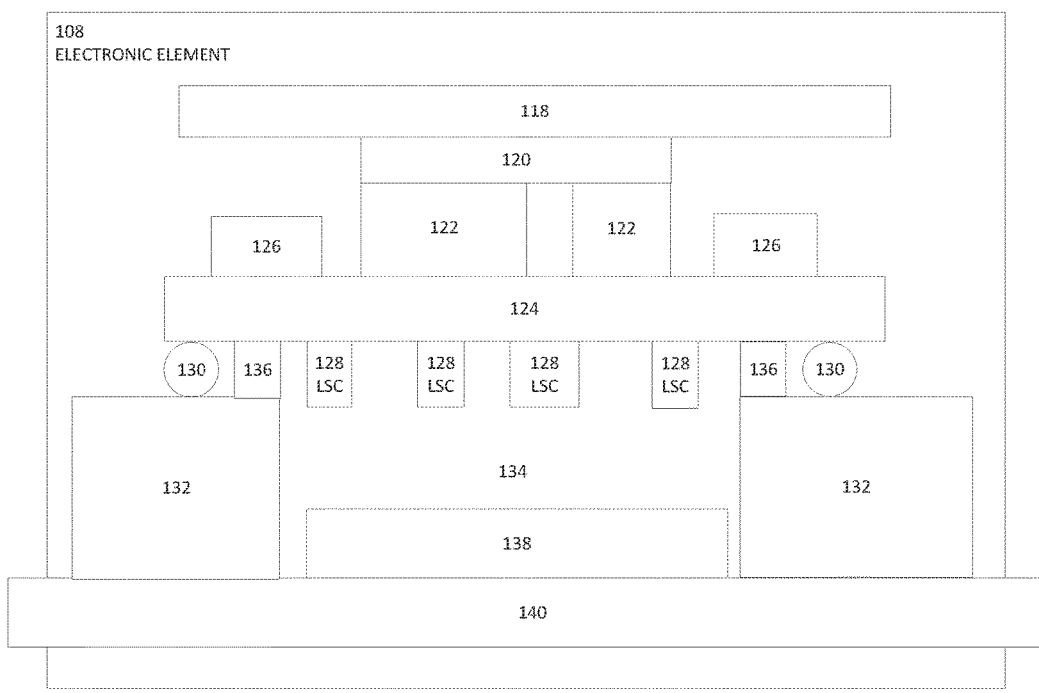
FIG. 9 is a simplified block diagram illustrating an embodiment of a portion of a thermal cooling system, in accordance with an embodiment of the present disclosure.

Turning to FIG. 9, FIG. 9 illustrates one embodiment of one of the stages of building or creating an electronic component or element that includes thermal component 110. In an embodiment, thermal transfer extension 140 can be added or coupled to thermal conducting plate 138 to help transfer heat or thermal energy away from thermal conducting plate 138. In an example, thermal transfer extension 140 can dissipating the heat by natural and/or forced convection (in case of fan or other flow movers) as well as by radiation.

Figure 10:
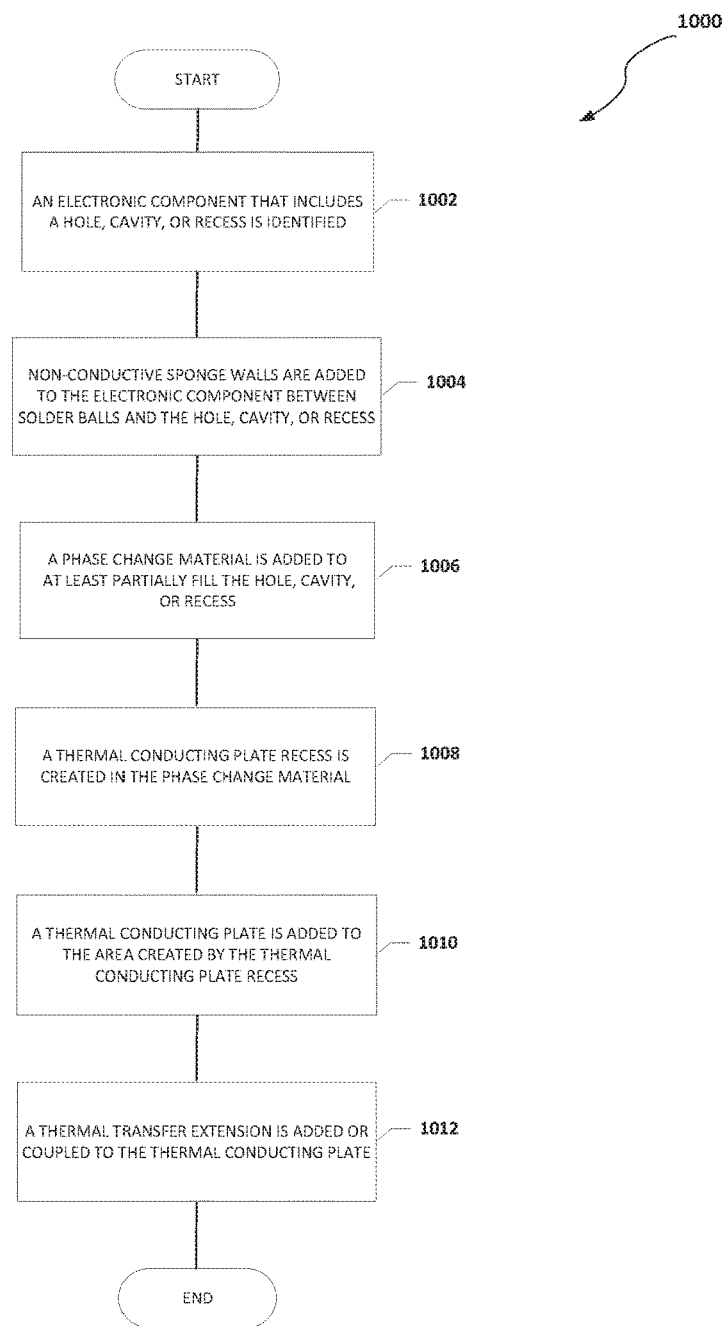
FIG. 10 is a simplified flowchart illustrating potential operations that may be associated with the system in accordance with an embodiment.

Turning to FIG. 10, FIG. 10 is an example flowchart illustrating possible operations of a flow 1000 that may be associated with enabling a thermal cooling system, in accordance with an embodiment. At 1002, an electronic component that includes a hole is identified. At 1004, non-conductive sponge walls are added to the electronic component between solder balls and the hole. At 1006, phase change material is added to at least partially fill the hole. At 1008, a thermal conducting plate recess is created in the phase change material. At 1010, a thermal conducting plate is added to the area created by the thermal conducting plate recess. At 1012, a thermal transfer extension is added or coupled to the thermal conducting plate. In an example, a pre-fabricated motherboard with a HiMB component is acquired and a pre-fabricated thermal component (e.g., thermal component 110) is added to the pre-fabricated motherboard. In yet another example, a pre-fabricated motherboard with a HiMB component is acquired and the phase change material (e.g., phase change material 134) and the thermal conducting plate (e.g., thermal conducting plate 138) are added or inserted into the pre-fabricated motherboard.

Figure 11:
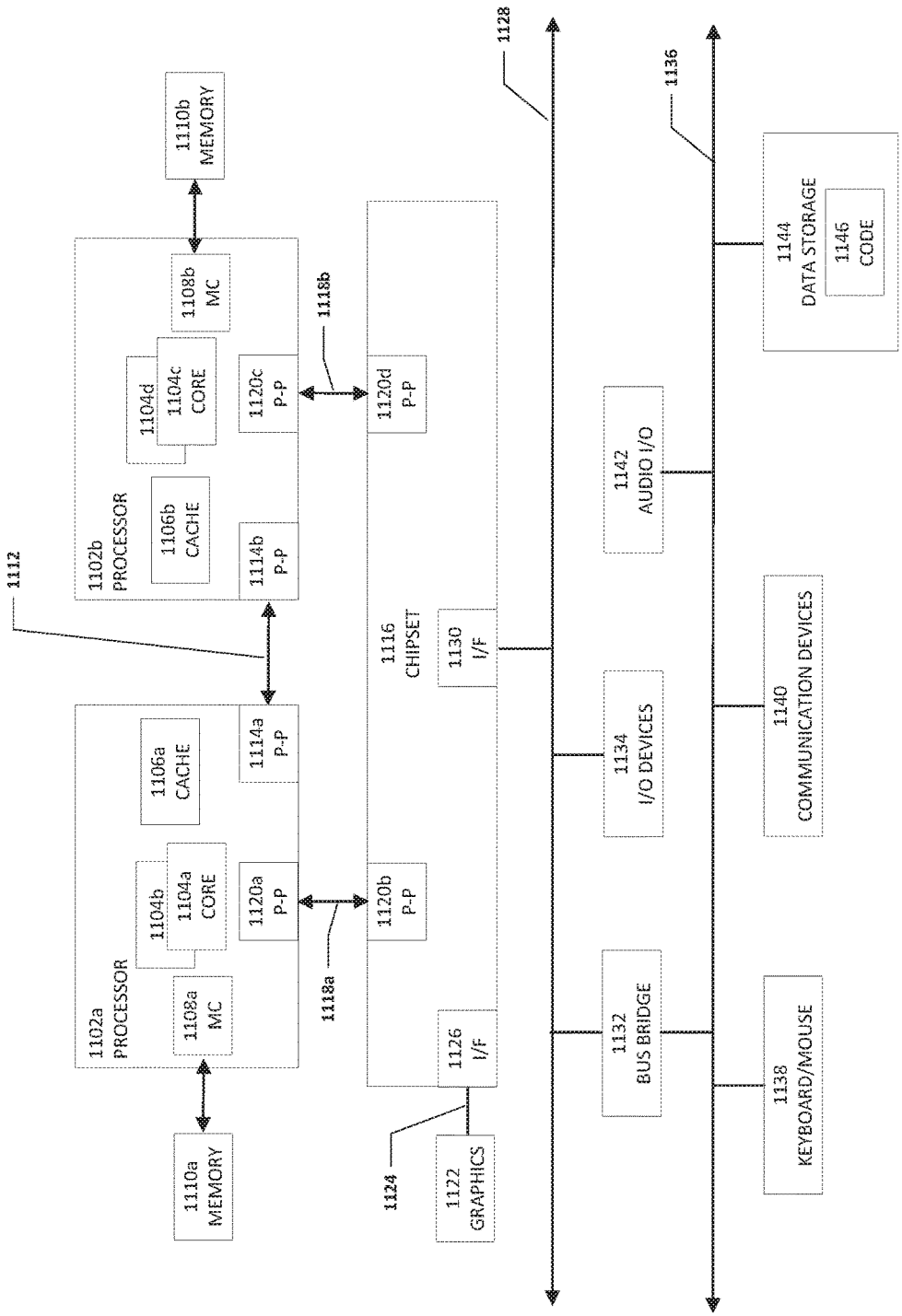
FIG. 11 is a block diagram illustrating an example computing system that is arranged in a point-to-point configuration in accordance with an embodiment.

Turning to FIG. 11, FIG. 11 illustrates a computing system 1100 that is arranged in a point-to-point (PtP) configuration according to an embodiment. In particular, FIG. 11 shows a system where processors, memory, and input/output devices are interconnected by a number of point-to-point interfaces. Generally, one or more of the network elements of system 100 may be configured in the same or similar manner as computing system 1100.

As illustrated in FIG. 11, system 1100 may include several processors, of which only two, processors 1102a and 1102b, are shown for clarity. While two processors 1102a and 1102b are shown, it is to be understood that an embodiment of system 1100 may also include only one such processor. Processors 1102a and 1102b may each include a set of cores (i.e., processors cores 1104a and 1104b and processors cores 1104c and 1104d) to execute multiple threads of a program. The cores may be configured to execute instruction code in a manner similar to that discussed above with reference to FIGS. 1-8. Each processor 1102a and 1102b may include at least one shared cache 1106a and 1106b respectively. Shared caches 1106a and 1106b may each store data (e.g., instructions) that are utilized by one or more components of processors 1102a and 1102b, such as processor cores 1104a and 1104b of processor 1102a and processor cores 1104c and 1104d of processor 1102b.

Processors 1102a and 1102b may also each include integrated memory controller logic (MC) 1108a and 1108b respectively to communicate with memory elements 1110a and 1110b. Memory elements 1110a and/or 1110b may store various data used by processors 1102a and 1102b. In alternative embodiments, memory controller logic 1108a and 1108b may be discrete logic separate from processors 1102a and 1102b.

Processors 1102a and 1102b may be any type of processor and may exchange data via a point-to-point (PtP) interface 1112 using point-to-point interface circuits 1114a and 1114b respectively. Processors 1102a and 1102b may each exchange data with a chipset 1116 via individual point-to-point interfaces 1118a and 1118b using point-to-point interface circuits 1120a-1120d. Chipset 1116 may also exchange data with a high-performance graphics circuit 1122 via a high-performance graphics interface 1124, using an interface circuit 1126, which could be a PtP interface circuit. In alternative embodiments, any or all of the PtP links illustrated in FIG. 11 could be implemented as a multi-drop bus rather than a PtP link.

Chipset 1116 may be in communication with a bus 1128 via an interface circuit 1130. Bus 1128 may have one or more devices that communicate over it, such as a bus bridge 1132 and I/O devices 1134. Via a bus 1136, bus bridge 1132 may be in communication with other devices such as a keyboard/mouse 1138 (or other input devices such as a touch screen, trackball, etc.), communication devices 1140 (such as modems, network interface devices, or other types of communication devices that may communicate through a network), audio I/O devices 1142, and/or a data storage device 1144. Data storage device 1144 may store code 1146, which may be executed by processors 1102a and/or 1102b. In alternative embodiments, any portions of the bus architectures could be implemented with one or more PtP links.

The computer system depicted in FIG. 11 is a schematic illustration of an embodiment of a computing system that may be utilized to implement various embodiments discussed herein. It will be appreciated that various components of the system depicted in FIG. 11 may be combined in a system-on-a-chip (SoC) architecture or in any other suitable configuration. For example, embodiments disclosed herein can be incorporated into systems including mobile devices such as smart cellular telephones, tablet computers, personal digital assistants, portable gaming devices, etc. It will be appreciated that these mobile devices may be provided with SoC architectures in at least some embodiments.

Figure 12:
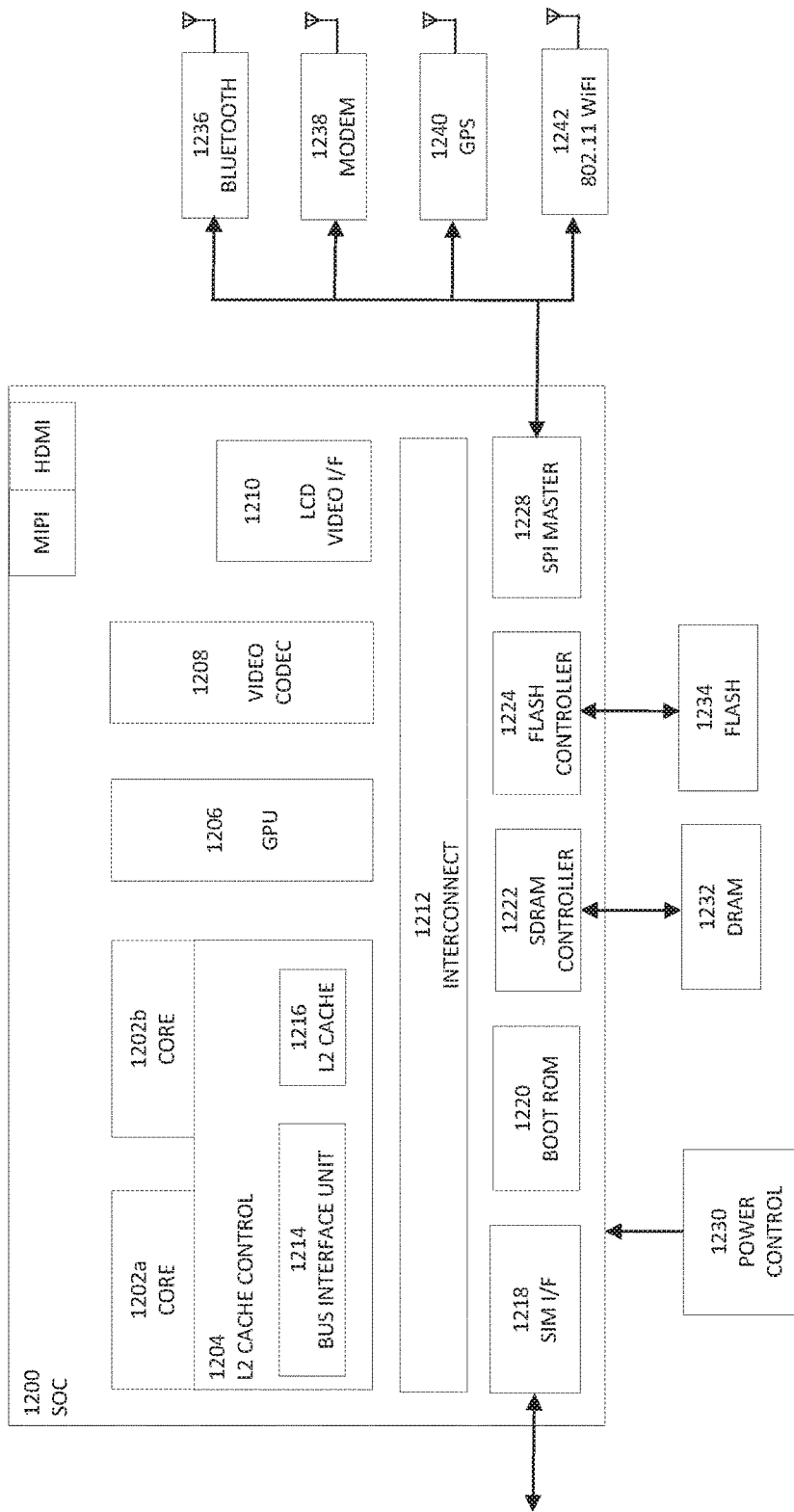
FIG. 12 is a simplified block diagram associated with an example ARM ecosystem system on chip (SOC) of the present disclosure.

Turning to FIG. 12, FIG. 12 is a simplified block diagram associated with an example ecosystem SOC 1200 of the present disclosure. At least one example implementation of the present disclosure can include the device pairing in a local network features discussed herein and an ARM component. For example, the example of FIG. 12 can be associated with any ARM core (e.g., A-9, A-15, etc.). Further, the architecture can be part of any type of tablet, smartphone (inclusive of Android™ phones, iPhones™), iPad™, Google Nexus™, Microsoft Surface™, personal computer, server, video processing components, laptop computer (inclusive of any type of notebook), Ultrabook™ system, any type of touch-enabled input device, etc.

In this example of FIG. 12, ecosystem SOC 1200 may include multiple cores 1202a and 1202b, an L2 cache control 1204, a graphics processing unit (GPU) 1206, a video codec 1208, a liquid crystal display (LCD) I/F 1210 and an interconnect 1212. L2 cache control 1204 can include a bus interface unit 1214, a L2 cache 1216. Liquid crystal display (LCD) I/F 1210 may be associated with mobile industry processor interface (MIPI)/ high-definition multimedia interface (HDMI) links that couple to an LCD.

Ecosystem SOC 1200 may also include a subscriber identity module (SIM) I/F 1218, a boot read-only memory (ROM) 1220, a synchronous dynamic random-access memory (SDRAM) controller 1222, a flash controller 1224, a serial peripheral interface (SPI) master 1228, a suitable power control 1230, a dynamic RAM (DRAM) 1232, and flash 1234. In addition, one or more embodiments include one or more communication capabilities, interfaces, and features such as instances of Bluetooth™ 1236, a 3G modem 0138, a global positioning system (GPS) 1240, and an 802.11 Wi-Fi 1242.

In operation, the example of FIG. 12 can offer processing capabilities, along with relatively low power consumption to enable computing of various types (e.g., mobile computing, high-end digital home, servers, wireless infrastructure, etc.). In addition, such an architecture can enable any number of software applications (e.g., Android™, Adobe® Flash® Player, Java Platform Standard Edition (Java SE), JavaFX, Linux, Microsoft Windows Embedded, Symbian and Ubuntu, etc.). In at least one example embodiment, the core processor may implement an out-of-order superscalar pipeline with a coupled low-latency level-2 cache.

Figure 13:
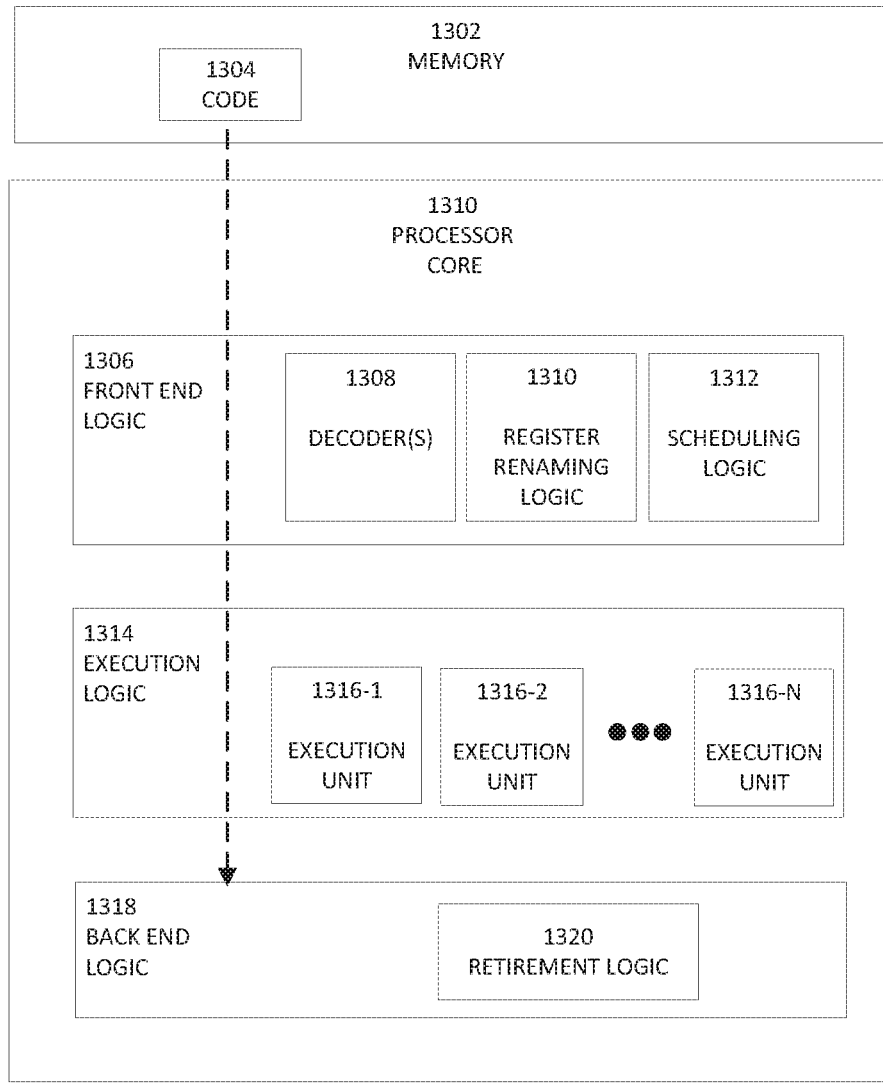
FIG. 13 is a block diagram illustrating an example processor core in accordance with an embodiment.

Turning to FIG. 13, FIG. 13 illustrates a processor core 1300 according to an embodiment. Processor core 1300 may be the core for any type of processor, such as a microprocessor, an embedded processor, a digital signal processor (DSP), a network processor, or other device to execute code. Although only one processor core 1300 is illustrated in FIG. 13, a processor may alternatively include more than one of the processor core 1300 illustrated in FIG. 13. For example, processor core 1300 represents one example embodiment of processors cores 1104a-1104d shown and described with reference to processors 1102a and 1102b of FIG. 11. Processor core 1300 may be a single-threaded core or, for at least one embodiment, processor core 1300 may be multithreaded in that it may include more than one hardware thread context (or "logical processor") per core.

FIG. 13 also illustrates a memory 1302 coupled to processor core 1300 in accordance with an embodiment. Memory 1302 may be any of a wide variety of memories (including various layers of memory hierarchy) as are known or otherwise available to those of skill in the art. Memory 1302 may include code 1304, which may be one or more instructions, to be executed by processor core 1300. Processor core 1300 can follow a program sequence of instructions indicated by code 1304. Each instruction enters a front-end logic 1306 and is processed by one or more decoders 1308. The decoder may generate, as its output, a micro operation such as a fixed width micro operation in a predefined format, or may generate other instructions, microinstructions, or control signals that reflect the original code instruction. Front-end logic 1306 also includes register renaming logic 1310 and scheduling logic 1312, which generally allocate resources and queue the operation corresponding to the instruction for execution.

Processor core 1300 can also include execution logic 1314 having a set of execution units 1316-1 through 1316-N. Some embodiments may include a number of execution units dedicated to specific functions or sets of functions. Other embodiments may include only one execution unit or one execution unit that can perform a particular function. Execution logic 1314 performs the operations specified by code instructions.

After completion of execution of the operations specified by the code instructions, back-end logic 1318 can retire the instructions of code 1304. In one embodiment, processor core 1300 allows out of order execution but requires in order retirement of instructions. Retirement logic 1320 may take a variety of known forms (e.g., re-order buffers or the like). In this manner, processor core 1300 is transformed during execution of code 1304, at least in terms of the output generated by the decoder, hardware registers and tables utilized by register renaming logic 1310, and any registers (not shown) modified by execution logic 1314.

Although not illustrated in FIG. 13, a processor may include other elements on a chip with processor core 1300, at least some of which were shown and described herein with reference to FIG. 11. For example, as shown in FIG. 11, a processor may include memory control logic along with processor core 1300. The processor may include I/O control logic and/or may include I/O control logic integrated with memory control logic.

In the above examples, the semiconductor substrate for substrate 124 (and any additional layers) may be formed using alternate materials, which may or may not be combined with silicon. This includes, but is not limited to, germanium, indium antimonide, lead telluride, indium arsenide, indium phosphide, gallium arsenide, indium gallium arsenide, gallium antimonide, or other combinations of group III-V or group IV materials. In other examples, the substrate of any layer may be a flexible substrate including 2D materials such as graphene and MoS2, organic materials such as pentacene, transparent oxides such as IGZO poly/ amorphous (low temperature of dep) III-V semiconductors and Ge/Si, and other non-silicon flexible substrates.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a substrate, one or more dies on a top portion of the substrate, one or more printed circuit boards below the substrate, where the printed circuit boards are coupled to the substrate with solder balls, one or more land side capacitors below the substrate, and a thermal conducting plate under the one or more land side capacitors.

In Example A2, the subject matter of Example A1 can optionally include a phase change material below the substrate, where the phase change material at least partially surrounds the land side capacitors and is in contact with the thermal conducting plate.

In Example A3, the subject matter of any one of Examples A1-A2 can optionally include sponge walls, where the sponge walls help to insulate the solder balls from the phase change material.

In Example A4, the subject matter of any one of Examples A1-A3 can optionally include where the phase change material has a low electrical conductivity.

In Example A5, the subject matter of any one of Examples A1-A4 can optionally include a thermal transfer extension coupled to the thermal conducting plate to transfer heat away from the thermal conducting plate.

In Example A6, the subject matter of any one of Examples A1-A5 can optionally include where the electronic device includes a hole-in-motherboard configuration.

In Example A7, the subject matter of any one of Examples A1-A6 can optionally include where the thermal conducting plate, phase change material, and one or more sponge walls are located in a hole of the hole-in-motherboard configuration.

Example AA1 is hole in motherboard device including a substrate, one or more dies on a top portion of the substrate, one or more printed circuit boards below the substrate, where the printed circuit boards are coupled to the substrate with solder balls, one or more land side capacitors below the substrate, and a thermal conducting plate under the one or more land side capacitors.

In Example AA2, the subject matter of Example AA1 can optionally include a phase change material below the substrate, where the phase change material at least partially surrounds the land side capacitors and is in contact with the thermal conducting plate.

In Example AA3, the subject matter of any one of Examples AA1-AA2 can optionally include sponge walls, where the sponge walls help to insulate the solder balls from the phase change material.

In Example AA4, the subject matter of any one of Examples AA1-AA3 can optionally include where the phase change material has a low electrical conductivity.

In Example AA5, the subject matter of any one of Examples AA1-AA4 can optionally include where a thermal transfer extension coupled to the thermal conducting plate to transfer heat away from the thermal conducting plate.

Example M1 is a method including identifying an electronic component that includes a hole below a substrate, adding phase change material to at least partially fill the hole, and adding a thermal conducting plate, where the thermal conducting plate is in contact with the phase change material.

In Example M2, the subject matter of Example M1 can optionally include where the electronic component includes one or more dies on a top portion of the substrate, one or more printed circuit boards below the substrate, where the printed circuit boards are coupled to the substrate with solder balls, and one or more land side capacitors below the substrate, where the thermal conducting plate under the one or more land side capacitors.

In Example M3, the subject matter of any one of the Examples M1-M2 can optionally include adding sponge walls, where the sponge walls help to insulate the solder balls from the phase change material.

In Example M4, the subject matter of any one of the Examples M1-M3 can optionally include where the phase change material has a low electrical conductivity.

In Example M5, the subject matter of any one of the Examples M1-M4 can optionally include adding a thermal transfer extension coupled to the thermal conducting plate to transfer heat away from the thermal conducting plate.

In Example M6, the subject matter of any one of the Examples M1-M5 can optionally include where the electronic component has a hole in motherboard configuration.

Example S1 is a device that includes a thermal cooling system. The device can include a substrate, one or more dies on a top portion of the substrate, a heat spreader over the one or more dies to transfer thermal energy away from the one or more dies, one or more printed circuit boards below the substrate, where the printed circuit boards are coupled to the substrate with solder balls, one or more land side capacitors below the substrate, and a thermal conducting plate under the one or more land side capacitors, where the thermal conducting plate transfers thermal energy away from the one or more dies.

In Example S2, the subject matter of Example S1 can optionally include a phase change material below the substrate, where the phase change material at least partially surrounds the land side capacitors and is in contact with the thermal conducting plate, where the phase change material transfers thermal energy away from the one or more dies to the thermal conducting plate.

In Example S3, the subject matter of any one of the Examples S1-S2 can optionally include sponge walls, where the sponge walls help to insulate the solder balls from the phase change material.

In Example S4, the subject matter of any one of the Examples S1-S3 can optionally include where the phase change material has a low electrical conductivity.

In Example S5, the subject matter of any one of the Examples S1-S4 can optionally include a thermal transfer extension coupled to the thermal conducting plate to transfer thermal energy away from the thermal conducting plate.

In Example S6, the subject matter of any one of the Examples S1-S5 can optionally include where the device includes a hole-in-motherboard configuration.

In Example S7, the subject matter of any one of the Examples S1-S6 can optionally include where the thermal conducting plate, phase change material, and one or more sponge walls are located in a hole of the hole-in-motherboard configuration.

Example X1 is a machine-readable storage medium including machine-readable instructions to implement a method or realize an apparatus as in any one of the Examples M1-M6. Example Y1 is an apparatus comprising means for performing any of the Example methods M1-M6. In Example Y2, the subject matter of Example Y1 can optionally include the means for performing the method. In Example Y3, the subject matter of Example Y2 can optionally include the memory comprising machine-readable instructions.

What is claimed is:

1. An electronic device comprising: a substrate; one or more dies on a top portion of the substrate; one or more printed circuit boards below the substrate, wherein the printed circuit boards are coupled to the substrate with solder balls; one or more land side capacitors below the substrate; a thermal conducting plate under the one or more land side capacitors; and a phase change material below the substrate, wherein the phase change material at least partially surrounds the land side capacitors and is in contact with the thermal conducting plate.

2. The electronic device of claim 1, further comprising:
sponge walls, wherein the sponge walls help to insulate the solder balls from the phase change material.

3. The electronic device of claim 1, wherein the phase change material has a low electrical conductivity.

4. The electronic device of claim 1, further comprising:
a thermal transfer extension coupled to the thermal conducting plate to transfer heat away from the thermal conducting plate.

5. The electronic device of claim 1, wherein the electronic device includes a hole-in-motherboard configuration.

6. The electronic device of claim 5, wherein the thermal conducting plate, phase change material, and one or more sponge walls are located in a hole of the hole-in-motherboard configuration.

7. A hole in motherboard device comprising: a substrate; one or more dies on a top portion of the substrate; one or more printed circuit boards below the substrate, wherein the printed circuit boards are coupled to the substrate with solder balls; one or more land side capacitors below the substrate; a thermal conducting plate under the one or more land side capacitors; and a phase change material below the substrate, wherein the phase change material at least partially surrounds the land side capacitors and is in contact with the thermal conducting plate.

8. The hole in motherboard device of claim 7, further comprising:
sponge walls, wherein the sponge walls help to insulate the solder balls from the phase change material.

9. The hole in motherboard device of claim 7, wherein the phase change material has a low electrical conductivity.

10. The hole in motherboard device of claim 7, comprising:
a thermal transfer extension coupled to the thermal conducting plate to transfer heat away from the thermal conducting plate.

11. A method comprising: identifying an electronic component that includes a hole below a substrate; adding phase change material to at least partially fill the hole; and adding a thermal conducting plate, wherein the thermal conducting plate is in contact with the phase change material, wherein the electronic component includes: one or more dies on a top portion of the substrate; one or more printed circuit boards below the substrate, wherein the printed circuit boards are coupled to the substrate with solder balls; and one or more land side capacitors below the substrate, wherein the thermal conducting plate under the one or more land side capacitors.

12. The method of claim 11, further comprising:
adding sponge walls, wherein the sponge walls help to insulate the solder balls from the phase change material.

13. The method of claim 11, wherein the phase change material has a low electrical conductivity.

14. The method of claim 11, further comprising:
adding a thermal transfer extension coupled to the thermal conducting plate to transfer heat away from the thermal conducting plate.

15. The method of claim 11, wherein the electronic component has a hole in motherboard configuration.

16. A device that includes a thermal cooling system, the device comprising: a substrate; one or more dies on a top portion of the substrate; a heat spreader over the one or more dies to transfer thermal energy away from the one or more dies; one or more printed circuit boards below the substrate, wherein the printed circuit boards are coupled to the substrate with solder balls; one or more land side capacitors below the substrate; a thermal conducting plate under the one or more land side capacitors, wherein the thermal conducting plate transfers thermal energy away from the one or more land side capacitors; and a phase change material below the substrate, wherein the phase change material at least partially surrounds the land side capacitors and is in contact with the thermal conducting plate, wherein the phase change material transfers thermal energy away from the one or more land side capacitors to the thermal conducting plate.

17. The thermal cooling system of claim 16, further comprising:
sponge walls, wherein the sponge walls help to insulate the solder balls from the phase change material.

18. The thermal cooling system of claim 16, wherein the phase change material has a low electrical conductivity.

19. The thermal cooling system of claim 16, wherein the device further comprises:
a thermal transfer extension coupled to the thermal conducting plate to transfer thermal energy away from the thermal conducting plate.

20. The thermal cooling system of claim 16, wherein the device includes a hole-in-motherboard configuration.

21. The thermal cooling system of claim 20, wherein the thermal conducting plate, phase change material, and one or more sponge walls are located in a hole of the hole-in-motherboard configuration.

* * * * *